(12) United States Patent
Bateman et al.

(10) Patent No.: US 12,094,739 B2
(45) Date of Patent: Sep. 17, 2024

(54) AUTOCLEAN FOR LOAD LOCKS IN SUBSTRATE PROCESSING SYSTEMS

(71) Applicant: LAM RESEARCH CORPORATION, Fremont, CA (US)

(72) Inventors: Adam Patrick Bateman, Fremont, CA (US); Travis R. Taylor, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/767,248

(22) PCT Filed: Oct. 5, 2020

(86) PCT No.: PCT/US2020/054217
§ 371 (c)(1),
(2) Date: Apr. 7, 2022

(87) PCT Pub. No.: WO2021/071767
PCT Pub. Date: Apr. 15, 2021

(65) Prior Publication Data
US 2022/0375773 A1 Nov. 24, 2022

Related U.S. Application Data

(60) Provisional application No. 62/912,584, filed on Oct. 8, 2019.

(51) Int. Cl.
*H01L 21/67* (2006.01)
*B08B 5/02* (2006.01)
(Continued)

(52) U.S. Cl.
CPC .......... *H01L 21/67201* (2013.01); *B08B 5/02* (2013.01); *B08B 13/00* (2013.01); *B08B 15/04* (2013.01)

(58) Field of Classification Search
CPC ......... H01L 21/67201; H01L 21/67028; B08B 5/02; B08B 13/00; B08B 15/04
See application file for complete search history.

(56) References Cited

U.S. PATENT DOCUMENTS

| 2002/0008099 A1* | 1/2002 | Davis ............... C23C 14/566 |
| | | 219/390 |
| 2004/0002299 A1* | 1/2004 | Lin ............... H01L 21/67017 |
| | | 414/935 |

(Continued)

FOREIGN PATENT DOCUMENTS

| KR | 1020060068249 A | 6/2006 |
| KR | 1020070029343 A | 3/2007 |

(Continued)

OTHER PUBLICATIONS

Machine translation of KR 20190014319 (Year: 2019).*

(Continued)

*Primary Examiner* — Erin F Bergner

(57) ABSTRACT

A method for cleaning a load lock in a substrate processing system includes, in a first period, opening a first valve in fluid communication with a gas source to supply gas through a first vent into a gas volume of the load lock. The gas is supplied at a pressure and flow rate sufficient to disturb particles from surfaces of the load lock. The method includes, in a second period subsequent to the first period and with the first valve opened, opening a second valve in fluid communication with a pump and turning on the pump to flush the gas and particles from the gas volume of the load lock, and, in a third period subsequent to the second period, closing the first valve while continuing to pump the gas and the particles from the gas volume of the load lock via the second valve.

24 Claims, 5 Drawing Sheets

(51) Int. Cl.
  *B08B 13/00*     (2006.01)
  *B08B 15/04*     (2006.01)

(56) References Cited

U.S. PATENT DOCUMENTS

| | | |
|---|---|---|
| 2004/0083588 A1 | 5/2004 | Park |
| 2006/0225299 A1 | 10/2006 | Kim et al. |
| 2007/0093069 A1 | 4/2007 | Tsai et al. |
| 2010/0163181 A1 | 7/2010 | Kobayashi et al. |
| 2012/0211029 A1 | 8/2012 | Pandit et al. |
| 2013/0248014 A1* | 9/2013 | Kobayashi ........ H01L 21/67109 137/334 |

FOREIGN PATENT DOCUMENTS

| | | |
|---|---|---|
| KR | 1020190014319 A | 2/2019 |
| TW | 201921567 A | 6/2019 |

OTHER PUBLICATIONS

International Search Report and Written Opinion of the ISA issued in PCT/US2020/054217, mailed Jan. 27, 2021; ISA/KR.
Taiwanese Office Action for TW Application No. 109134707 dated Mar. 6, 2024.

* cited by examiner

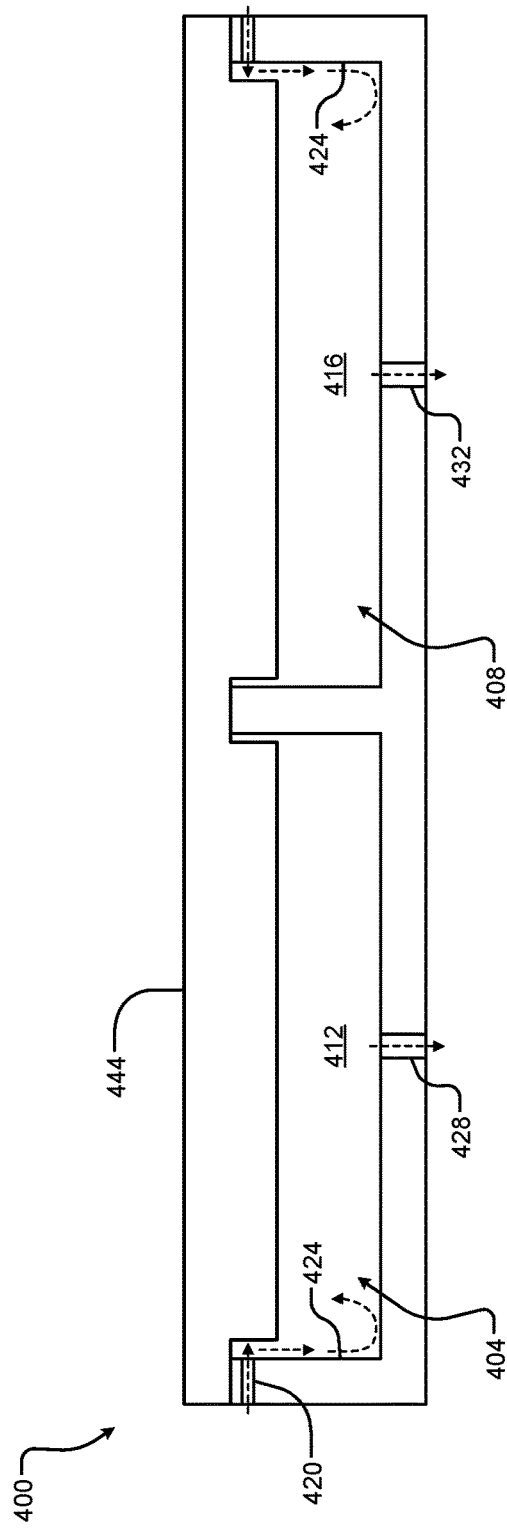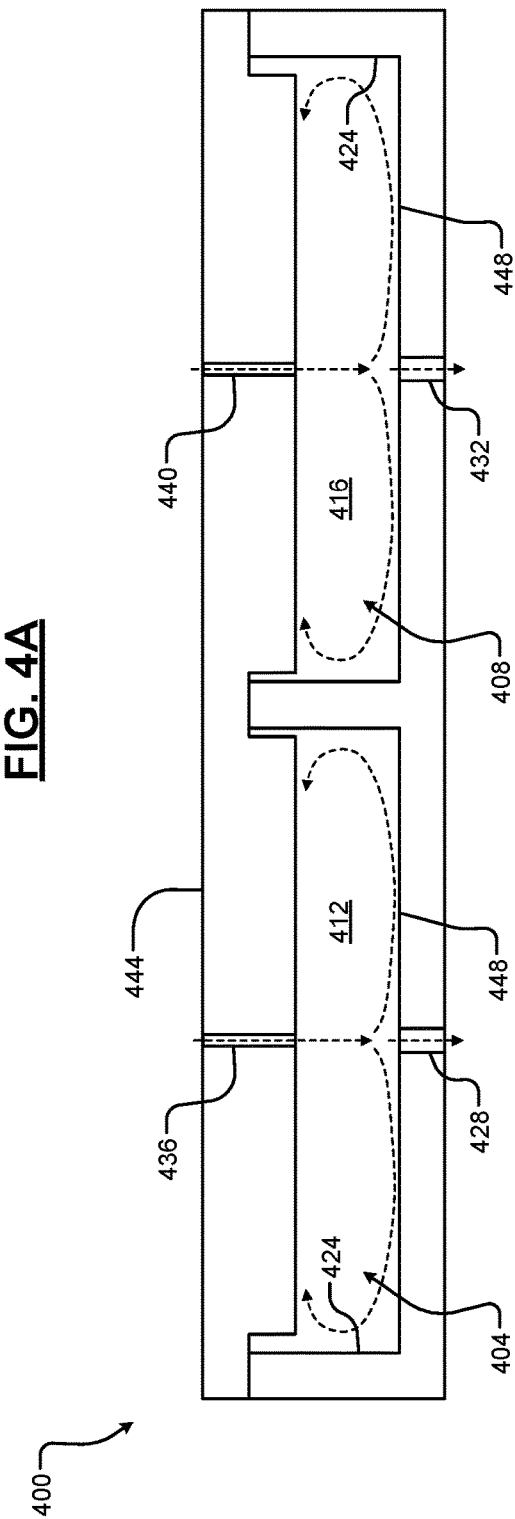

AUTOCLEAN FOR LOAD LOCKS IN SUBSTRATE PROCESSING SYSTEMS

CROSS-REFERENCE TO RELATED APPLICATIONS

This application is a U.S. National Phase Application under 35 U.S.C. 371 of International Application No. PCT/US2020/054217, filed on Oct. 5, 2020, which claims the benefit of U.S. Provisional Application No. 62/912,584, filed on Oct. 8, 2019. The entire disclosures of the applications referenced above are incorporated herein by reference.

FIELD

The present disclosure relates to cleaning components in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, rapid thermal processing (RTP), ion implant, physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During processing, gas mixtures including one or more precursors may be introduced into the processing chamber and plasma may be used to initiate chemical reactions.

SUMMARY

A method for cleaning a load lock in a substrate processing system includes, in a first period, opening a first valve in fluid communication with a gas source to supply gas through a first vent into a gas volume of the load lock. The gas is supplied at a pressure and flow rate sufficient to disturb particles from surfaces of the load lock. The method includes, in a second period subsequent to the first period and with the first valve opened, opening a second valve in fluid communication with a pump and turning on the pump to flush the gas and particles from the gas volume of the load lock, and, in a third period subsequent to the second period, closing the first valve while continuing to pump the gas and the particles from the gas volume of the load lock via the second valve.

In other features, the first vent corresponds to an annular vent surrounding an outer perimeter of the load lock. The first vent corresponds to a bottom vent through a bottom of the load lock. The first vent corresponds to a top vent through a lid of the load lock. The gas is supplied through the first vent at a flow rate of at least 170 standard liters per minute. The first period is 0-10 seconds. The first period is less than one second. The second period is 1-60 seconds. The second period is less than ten seconds. The third period is 0.5-1.5 seconds. The method further includes repeating opening the first valve, opening the second valve and turning on the pump, and closing the first valve.

In other features, the method further includes, in the first period, opening a third valve in fluid communication with the gas source to supply the gas through a third vent into the gas volume of the load lock. The method further includes alternating opening the first valve and the third valve in the first period. The method further includes, in a fourth period, opening a third valve in fluid communication with the gas source to supply the gas through a third vent into the gas volume of the load lock, in a fifth period subsequent to the fourth period and with the third valve opened, opening the second valve and turning on the pump to flush the gas and particles from the gas volume of the load lock, and, in a sixth period subsequent to the fifth period, closing the third valve while continuing to pump the gas and the particles from the gas volume of the load lock via the second valve.

A system for cleaning a load lock in a substrate processing system includes a first valve in fluid communication with a gas source and a gas volume of the load lock, a second valve in fluid communication with a pump and the gas volume, and a controller configured to, in a first period, open the first valve to supply gas through a first vent into the gas volume of the load lock. The gas is supplied at a pressure and flow rate sufficient to disturb particles from surfaces of the load lock. The controller is further configured to, in a second period subsequent to the first period and with the first valve opened, open the second valve and turn on the pump to flush the gas and the particles from the gas volume of the load lock, and in a third period subsequent to the second period, close the first valve while continuing to pump the gas and the particles from the gas volume of the load lock via the second valve.

In other features, the first vent corresponds to an annular vent surrounding an outer perimeter of the load lock. The first vent corresponds to a bottom vent through a bottom of the load lock. The first vent corresponds to a top vent through a lid of the load lock. The controller is configured to control supply of the gas through the first vent at a flow rate of at least 170 standard liters per minute. The first period is 0-10 seconds. The first period is less than one second. The second period is 1-60 seconds. The second period is less than ten seconds. The third period is 0.5-1.5 seconds. The controller is configured to repeat the opening the first valve, opening the second valve and turning on the pump, and closing the first valve.

In other features, in the first period, the controller is configured to open a third valve in fluid communication with the gas source to supply the gas through a third vent into the gas volume of the load lock. The controller is configured to alternate opening the first valve and the third valve in the first period. The controller is further configured to, in a fourth period, open a third valve in fluid communication with the gas source to supply the gas through a third vent into the gas volume of the load lock, in a fifth period subsequent to the fourth period and with the third valve opened, open the second valve and turn on the pump to flush the gas and particles from the gas volume of the load lock, and, in a sixth period subsequent to the fifth period, close the third valve while continuing to pump the gas and the particles from the gas volume of the load lock via the second valve.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A, 4B, and 4C are example load lock configurations according to the principles of the present disclosure.

In the drawings, reference numbers may be reused to identify similar and/or identical elements.

DETAILED DESCRIPTION

Figure 1:
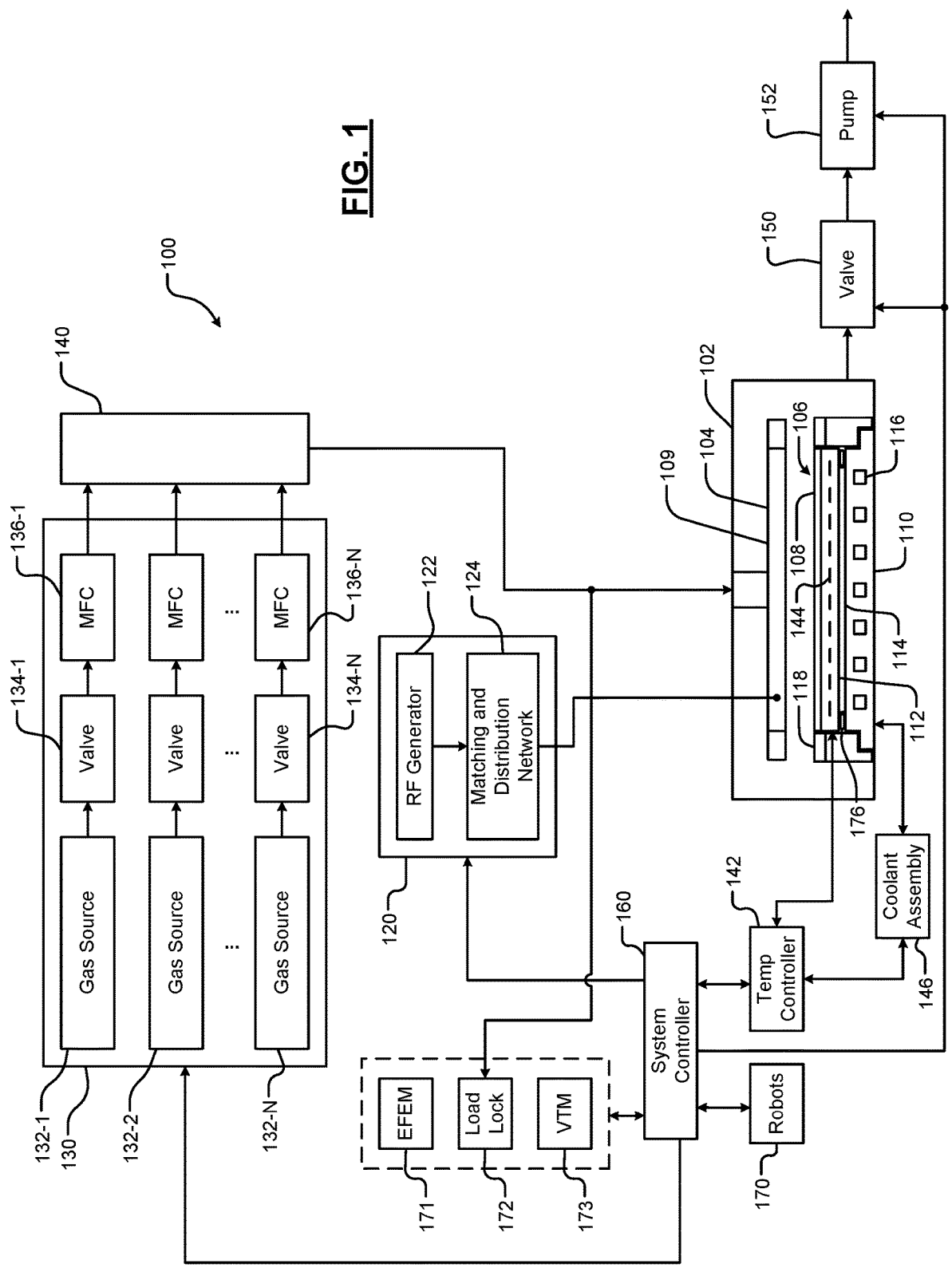
FIG. 1 is an example substrate processing system according to the principles of the present disclosure.

In a substrate processing system, substrates may be transferred to and from processing chambers through various modules or chambers defining respective volumes including, but not limited to, an equipment front end module, a load lock, and/or a vacuum transfer module. As substrates are transferred throughout the substrate processing system, particles accumulate within the various chambers over time. For example, particles may be formed via mechanical contact between components of the chambers, between components of the chambers and incoming and/or process substrates, etc.

Typically, chambers and respective components are precision cleaned (e.g., using various processes including acids, bases, sonication, detergents, etc.) prior to being assembled. Subsequent to assembly, precision cleaning is more difficult and may not be feasible for most substrate processing systems. For example, only some components may be removed relatively easily for precision cleaning. Performing precision cleaning on other components, including the walls of the chambers, may require disassembly, transfer to a cleaning facility, and subsequent reinstallation. Accordingly, post-assembly precision cleaning is time consuming and increases operation costs.

In some examples, various cleaning processes may be performed. For example, after a predetermined amount of particle accumulation (e.g., when a particle count as measured on a substrate exceeds a predetermined threshold), production may be interrupted to open the chambers to perform a wet cleaning process. For example, interiors of the chambers may be wet cleaned using clean room wipes. However, interrupting production to perform wet cleaning decreases throughput. Further, wet cleaning does not efficiently remove all of the accumulated particles.

In other examples, a pump and vent cleaning process may be performed. In a pump/vent cycle, a gas is pumped into a chamber and is subsequently vented. However, cleaning efficiency using multiple pump/vent cycles is very low. For example, thousands of pump/vent cycles (e.g., 9000 or more) may be required to clean a chamber such as a load lock.

Autoclean systems and methods according to the present disclosure are configured to loft accumulated particles within a chamber into the gas volume for efficient removal. Conventional venting of chambers such as load locks minimizes flow and fluid velocity to prevent disturbance of accumulated particles. Accordingly, particles are not lofted (i.e., caused to be airborne within the volume) and removal of the particles is limited. Conversely, the autoclean systems and methods of the present disclosure provide increased flow and velocity within the chambers in one or more alternating loft, flush, and pump cycles to increase the particle removal rate.

Although described with respect to the load lock, the principles of the present disclosure may also be implemented within other chambers of the substrate processing system, including, but not limited to, vacuum transfer modules (VTMs), process modules, etc.

Referring now to FIG. 1, an example substrate processing system 100 is shown. For example only, the substrate processing system 100 may be used for performing deposition and/or etching using RF plasma and/or other suitable substrate processing. The substrate processing system 100 includes a processing chamber 102 that encloses other components of the substrate processing system 100 and contains the RF plasma. The processing chamber 102 includes an upper electrode 104 and a substrate support 106, such as an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, ..., and 132-N (collectively gas sources 132), where N is an integer greater than zero. The gas sources supply one or more gas mixtures. The gas sources may also supply purge gas. Vaporized precursor may also be used. The gas sources 132 are connected by valves 134-1, 134-2, ..., and 134-N (collectively valves 134) and mass flow controllers 136-1, 136-2, ..., and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. One or more robots 170 may be used to deliver substrates onto, and remove substrates from, the substrate support 106. For example, the robots 170 may transfer substrates between an EFEM 171 and a load lock 172, between the load lock and a VTM 173, between the VTM 173 and the substrate support 106, etc. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate processing system 100 is configured for autoclean systems and methods to remove particles from the load lock 172 (and/or other chambers such as the EFEM 171, the VTM 173, etc.) according to the principles of the present disclosure. For example, the system controller 160 may be configured to control the gas delivery system Referring now to FIG. 2, an example autoclean system 200 configured to perform an autoclean (e.g., pump/vent) process on a load lock 204 is described in more detail. The load lock 204 remains closed (i.e., unopened to atmosphere) during the autoclean process. In other words, the autoclean process is performed in situ.

The autoclean system 200 includes a gas delivery system 208, which may correspond to the gas delivery system 130 as shown in FIG. 1 or may correspond to a separate gas delivery system. The gas delivery system 208 includes at least one gas source 212 and a valve 216. The gas source 212 stores a cleaning or purge gas (e.g., molecular nitrogen, or $N_2$), a mixture of gases, etc. The gas source 212 may be pressurized (i.e., stored under pressure as a liquid). A controller 220 (e.g., corresponding to the system controller 160) selectively opens and closes the valve 216 to flow the pressurized gas into the load lock 204. The gas flowing into the load lock 204 lofts particles accumulated on interior surfaces of the load lock 204 into a gas volume 224. Conversely, the controller 220 is configured to control a valve 228 and pump 232 to flush (i.e., evacuate) the gas and airborne particles from the load lock 204 and pump the load lock 204 down to a vacuum pressure. The controller 220 may be responsive to inputs including, but not limited to, user inputs and signals received from respective sensors 236.

Although shown with a single valve 216 and corresponding vent location 240, in some examples the load lock 204 may include multiple vent locations and corresponding valves. For example, vent locations may include, but are not limited to, side, top, and bottom surfaces of the load lock 204.

Figure 2:
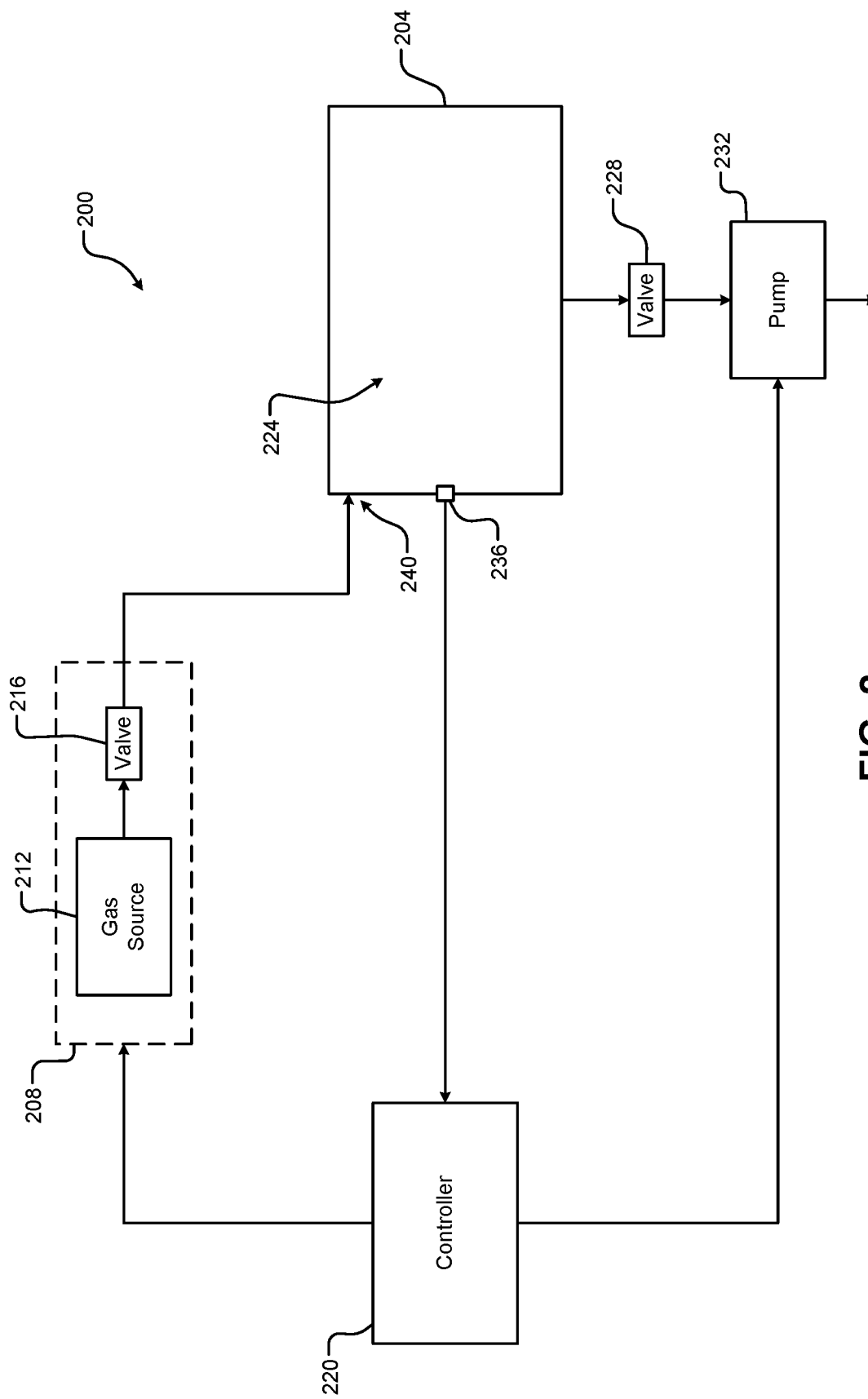
FIG. 2 is an example autoclean system according to the principles of the present disclosure.
Figure 3:
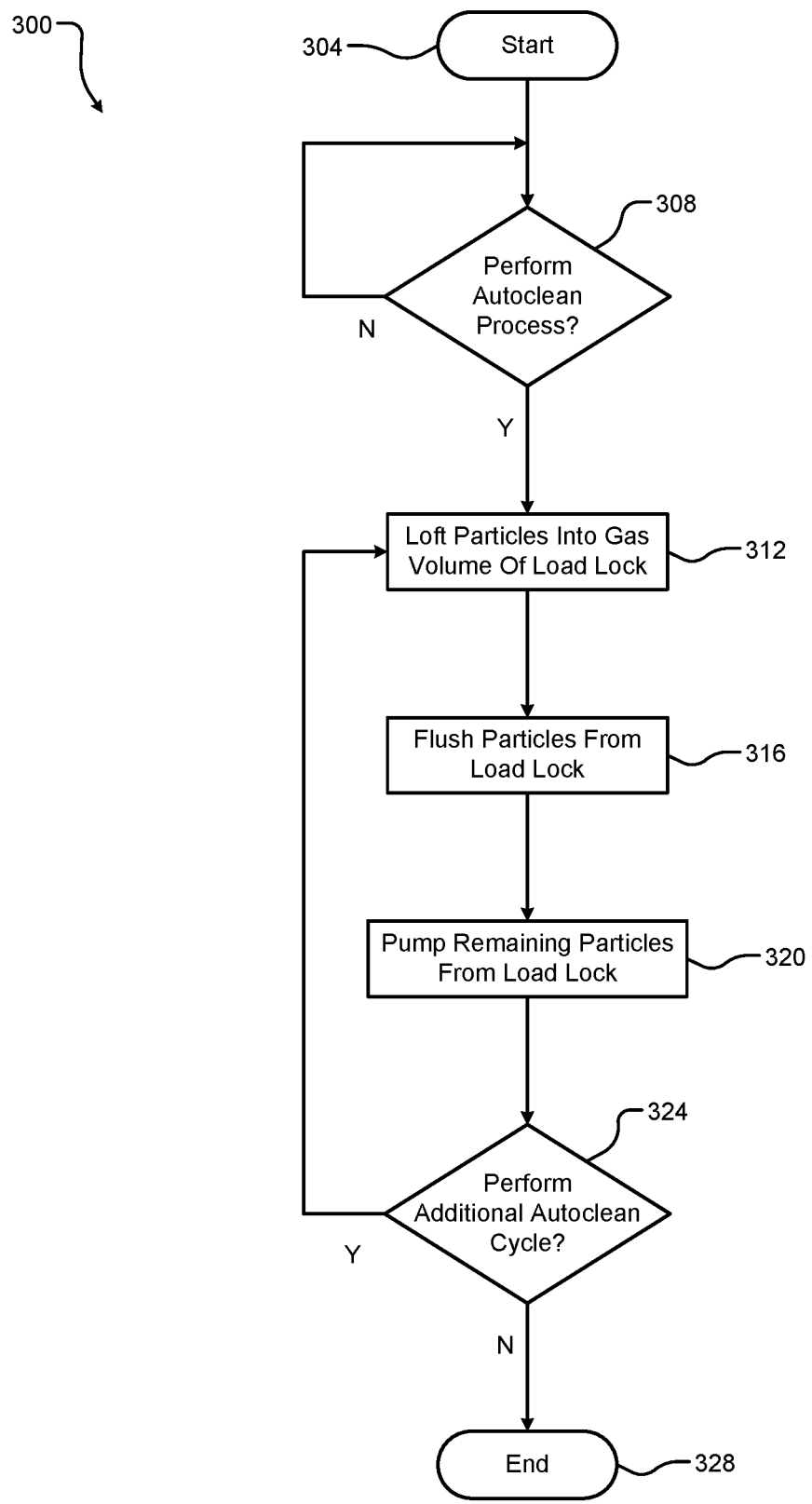
FIG. 3 is an example method for performing an autoclean process on a load lock according to the principles of the present disclosure.

Referring now to FIG. 3 and with continued reference to FIG. 2, an example method 300 for performing an autoclean process on a load lock according to the present disclosure begins at 304. At 308, the method 300 determines whether to perform the autoclean process. For example, the controller 220 may initiate the autoclean process in response to one or more signals (e.g., from respective ones of the sensors 236) indicating an amount of particular accumulation within the load lock 204, periodically, conditionally, etc. For example only, one or more of the sensors 236 may be configured to function as a particle counter that detects buildup of particles on the sensor. The controller 220 may be configured to trigger the autoclean process for a predetermined period subsequent to a previous instance that the autoclean process was performed, in response to a predetermined number of substrates being processed and/or transferred within the load lock 204, etc. In some examples, the controller 220 may perform the autoclean process responsive to user inputs.

If the result of 308 is true, the method 300 continues to 312. If false, the method 300 returns to 308. At 312, the method 300 lofts particles within the load lock 204 into the gas volume 224 in a loft step or period. For example, the controller 220 opens the valve 216 to provide pressurized gas from the gas source 212 into the load lock 204 at a flow rate sufficient to disturb particles from surfaces of the load lock 204 and to become airborne. The valve 228 remains closed during the loft period.

For example only, $N_2$ or another gas (or gas mixture) is provided at approximately 70 psi (e.g., 65-75 psi) to achieve a flow rate of at least 170 standard liters per minute (SLM). In some examples, the flow rate of the gas is between 180 and 250 SLM. The loft period may be between 0 and 10 seconds. In some examples, the loft period is less than 1 second (e.g., 0.5 seconds). Prior to the loft period, a pressure within the load lock 204 may be a vacuum pressure (e.g., less than 1 torr). The pressure within the load lock 204 may increase during the loft period (e.g., to 700-800 torr).

Subsequent to the loft period, the method 300 flushes the disturbed, lofted particles from the load lock 204 in a flush step or period at 316. For example, the valve 216 remains open and the controller 200 opens the valve 228 and turns on the pump 232. For example, only, the pump 232 is operated at a pump speed of at least 1700 SLM. With the valves 216 and 228 open, pressurized gas continues to flow into the load lock through the valve 216 to flush both the particles and the gas from the load lock 204 via the valve 228. The flow rate of the gas and particles during the flush period me be at least 170 SLM (e.g., 180-250 SLM). The flush period may be between 1 and 60 seconds. In some examples, the flush period is between 1 and 10 seconds. The pressure within the load lock 204 may decrease during the loft period from 700-800 torr to less than 1 torr.

In some examples, the pump speed may be controlled to maintain a desired pressure within the load lock 204 during the flush period. For example, flushing efficiency may vary with pressure for a different load locks or other chambers. Accordingly, the pump speed may be controlled to maintain the pressure within a desired range (e.g., 10-100 torr) during the flush period. For example only, the sensors 236 may include a pressure sensor configured to provide a signal indicative of pressure within the load lock 204. The sensors 236 may also include respective sensors configured to measure other parameters within the load lock 204 including, but not limited to, flow rates/velocities at various locations within the load lock 204. In this manner, pressure, pump speed, etc. may be controlled to achieve desired flow rates for respective periods.

Subsequent to the flush period, the method 300 removes remaining lofted particles from the load lock 204 and pumps the load lock 204 down to a desired vacuum pressure in a pump step or period at 320. For example, the valve 228 remains open and the controller 200 closes the valve 216. With the valve 228 open, the pump on (e.g., at 1700 SLM or greater), and the valve 216 closed, remaining gas and disturbed particles are pumped out of the load lock 204. The pump period may be approximately 1 second (e.g., between 0.5 and 1.5 seconds). The pressure within the load lock 204 may be maintained at less than 1 torr during the pump period. In some examples, the pump period may be continued until a desired pressure is reached (e.g., less than 40 mtorr).

Subsequent to the flush period, the method 300 determines whether to perform an additional autoclean cycle at 324. For example, one autoclean cycle may comprise one loft period, one flush period, and one pump period, and the autoclean process may comprise two or more autoclean (loft/flush/pump) cycles. In some examples, a predetermined number of autoclean cycles are performed (e.g., 2-1000 cycles). In other examples, autoclean cycles may be repeated until a sensed particle level (e.g., via the sensors 236) is less than a predetermined threshold. If the result of 324 is true, the method 300 continues to 312. If false, the method 300 ends at 328.

Although described with respect to control of the valve 216 and the vent location 240, in some examples multiple valves may be separately controlled to provide the gas to the load lock 204 via respective vent locations. For example, the autoclean process may include opening a first valve corresponding to a first vent location in loft and flush periods of a first autoclean cycle, opening a second valve corresponding to a second vent location in loft and flush periods of a second autoclean cycle, opening a third valve corresponding to a third vent location in loft and flush periods of a third autoclean cycle, etc. In some examples, each vent may be opened in a predetermined number of autoclean cycles. The same vent may be opened in consecutive autoclean cycles or the opened vent may be different in consecutive autoclean cycles (i.e., the opened vent may alternate).

Figure 4C:
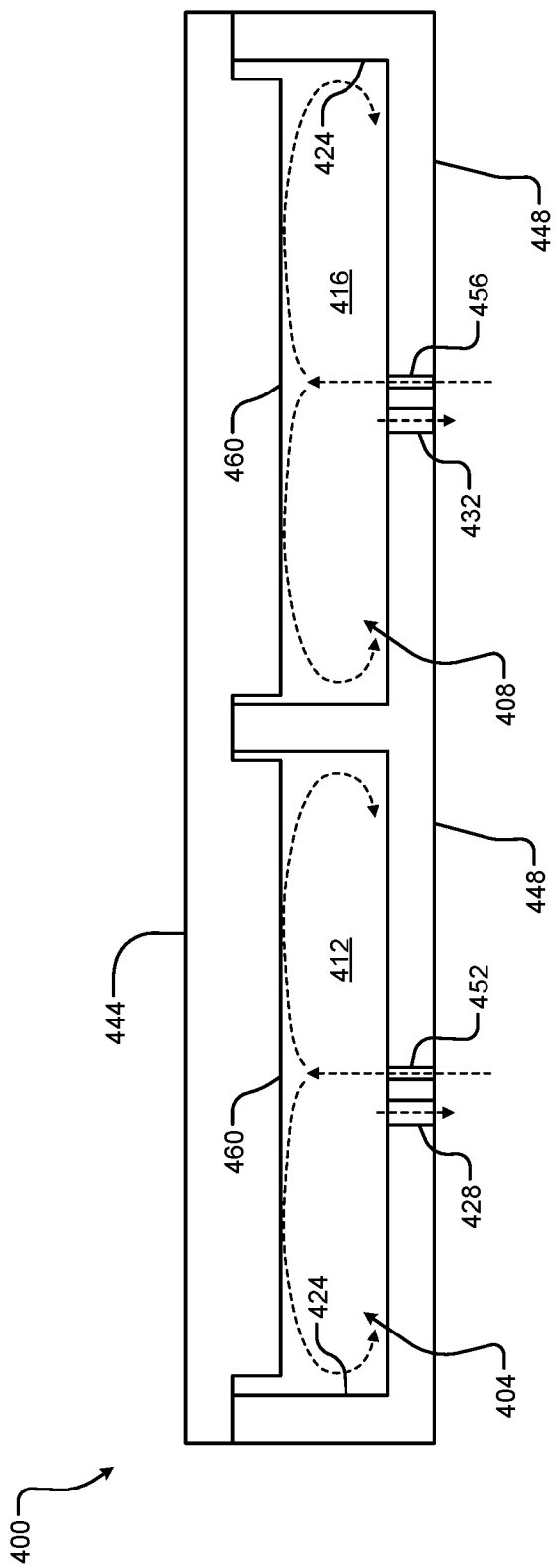

Referring now to FIGS. 4A, 4B, and 4C, example configurations of a load lock 400 according to the present disclosure are shown. The load lock 400 includes first and second chambers 404 and 408 configured to hold respective substrates. The chambers 404 and 408 define respective gas volumes 412 and 416. As shown in FIG. 4A, the load lock 400 includes an annular vent 420. For example, the annular vent 420 surrounds or partially surrounds an outer perimeter of an upper region of the load lock 400. Gas is supplied into the chambers 404 and 408 via the annular vent 420 to loft particles within the gas volumes 412 and 416 in a loft period as described above. For example, the gas is supplied inward through the annular vent 420 and is directed downward along inner walls 424 of the chambers 404 and 408. The gas and particles generally follow a path as shown by the dashed arrows. Accordingly, the gas disturbs particles accumulated on the inner walls 424 and lofts the particles into the gas volumes 412 and 416. The gas and particles are flushed and/or pumped out of the chambers 404 and 408 via respective pump vents 428 and 432.

As shown in FIG. 4B, the load lock 400 includes top vents 436 and 440 arranged to supply the gas into the respective chambers 404 and 408 (e.g., through a lid 444 of the load lock 400). Gas is supplied into the chambers 404 and 408 via the top vents 436 and 440 to loft particles within the gas volumes 412 and 416 in a loft period as described above. For example, the gas is supplied downward through the top vents 436 and 440 and is directed radially outward along bottom surfaces 448 and then upward along the inner walls 424 of the chambers 404 and 408. The gas and particles generally follow a path as shown by the dashed arrows.

As shown in FIG. 4C, the load lock 400 includes bottom vents 452 and 456 arranged to supply the gas into the respective chambers 404 and 408 (e.g., through a lid 444 of the load lock 400). Gas is supplied into the chambers 404 and 408 via the bottom vents 452 and 456 to loft particles within the gas volumes 412 and 416 in a loft period as described above. For example, the gas is supplied upward through the bottom vents 452 and 456 and is directed radially outward along top surfaces 460 and then downward along the inner walls 424 of the chambers 404 and 408. The gas and particles generally follow a path as shown by the dashed arrows.

Although shown in separate configurations of the load lock 400 in FIGS. 4A, 4B, and 4C, in other examples the load lock 400 can include vents in two or more locations. For example, the load lock 400 may include two or more of the annular vent 420, the top vents 436 and 440, and the bottom vents 452 and 456. Accordingly, particles may be disturbed and lofted from each of the inner walls 424, the bottom surfaces 448, and the top surfaces 460 of the chambers 404 and 408 by supplying gas through respective vents. For example, respective valves corresponding to the annular vent 420, the top vents 436 and 440, and the bottom vents 452 and 456 may be sequentially opened in a same loft period, opened in different loft periods in respective autoclean cycles, etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for cleaning a load lock in a substrate processing system, the method comprising:
   (a) in a first period, opening a first valve in fluid communication with a gas source to supply gas downward through a top vent into a gas volume of the load lock, wherein the top vent is in a top surface of the load lock and the gas is supplied at a pressure and flow rate sufficient to disturb particles from at least a bottom surface of the load lock;
   (b) in a second period subsequent to the first period and with the first valve opened, (i) opening a second valve in fluid communication with a pump and (ii) turning on the pump to flush the gas and particles from the gas volume of the load lock;

(c) in a third period subsequent to the second period, closing the first valve while continuing to pump the gas and the particles from the gas volume of the load lock via the second valve;

(d) in a fourth period, opening a third valve in fluid communication with the gas source to supply the gas upward through a bottom vent into the gas volume of the load lock, wherein the bottom vent is in the bottom surface of the load lock, and the gas is supplied at a pressure and flow rate sufficient to disturb particles from at least the top surface of the load lock;

(e) in a fifth period subsequent to the fourth period and with the third valve opened, (i) opening the second valve and (ii) turning on the pump to flush the gas and particles from the gas volume of the load lock; and (f) in a sixth period subsequent to the fifth period, closing the third valve while continuing to pump the gas and the particles from the gas volume of the load lock via the second valve.

2. The method of claim 1, wherein supplying gas includes supplying gas through an annular vent surrounding an outer perimeter of the load lock.

3. The method of claim 1, wherein the top vent extends through a lid of the load lock.

4. The method of claim 1, wherein the gas is supplied through the top vent at a flow rate of at least 170 standard liters per minute.

5. The method of claim 1, wherein the first period is 0-10 seconds.

6. The method of claim 1, wherein the first period is less than one second.

7. The method of claim 1, wherein the second period is 1-60 seconds.

8. The method of claim 1, wherein the second period is less than ten seconds.

9. The method of claim 1, wherein the third period is 0.5-1.5 seconds.

10. The method of claim 1, further comprising repeating (a), (b), and (c).

11. The method of claim 1, further comprising, in the first period, opening a fourth valve in fluid communication with the gas source to supply the gas through a third vent into the gas volume of the load lock.

12. The method of claim 11, further comprising alternating opening the first valve and the fourth valve in the first period.

13. A system for cleaning a load lock in a substrate processing system, the system comprising:
a first valve in fluid communication with a gas source and a gas volume of the load lock;
a second valve in fluid communication with a pump and the gas volume; and
a controller configured to
(a) in a first period, open the first valve to supply gas downward through a top vent into the gas volume of the load lock, wherein the top vent is in a top surface of the load lock and the gas is supplied at a pressure and flow rate sufficient to disturb particles from at least a bottom surface of the load lock;

(b) in a second period subsequent to the first period and with the first valve opened, (i) open the second valve and (ii) turn on the pump to flush the gas and the particles from the gas volume of the load lock;

(c) in a third period subsequent to the second period, close the first valve while continuing to pump the gas and the particles from the gas volume of the load lock via the second valve;

(d) in a fourth period, open a third valve in fluid communication with the gas source to supply the gas upward through a bottom vent into the gas volume of the load lock, wherein the bottom vent is in the bottom surface of the load lock, and the gas is supplied at a pressure and flow rate sufficient to disturb particles from at least the top surface of the load lock;

(e) in a fifth period subsequent to the fourth period and with the third valve opened, (i) open the second valve and (ii) turn on the pump to flush the gas and particles from the gas volume of the load lock; and (f) in a sixth period subsequent to the fifth period, close the third valve while continuing to pump the gas and the particles from the gas volume of the load lock via the second valve.

14. The system of claim 13, wherein supplying gas includes supplying gas through an annular vent surrounding an outer perimeter of the load lock.

15. The system of claim 13, wherein the top vent extends through a lid of the load lock.

16. The system of claim 13, wherein the controller is configured to control supply of the gas through the top vent at a flow rate of at least 170 standard liters per minute.

17. The system of claim 13, wherein the first period is 0-10 seconds.

18. The system of claim 13, wherein the first period is less than one second.

19. The system of claim 15, wherein the second period is 1-60 seconds.

20. The system of claim 13, wherein the second period is less than ten seconds.

21. The system of claim 13, wherein the third period is 0.5-1.5 seconds.

22. The system of claim 13, wherein the controller is configured to repeat (a), (b), and (c).

23. The system of claim 13, wherein, in the first period, the controller is configured to open a fourth valve in fluid communication with the gas source to supply the gas through a third vent into the gas volume of the load lock.

24. The system of claim 23, wherein the controller is configured to alternate opening the first valve and the fourth valve in the first period.

* * * * *